US009537067B2

(12) United States Patent
Brosche et al.

(10) Patent No.: US 9,537,067 B2
(45) Date of Patent: Jan. 3, 2017

(54) RADIATION EMITTING DEVICE

(75) Inventors: Christoph Brosche, Heidelberg (DE); Daniel Brüggemann, Berlin (DE)

(73) Assignee: Technische Universität Berlin, Berlin (DE)

(*) Notice: Subject to any disclaimer, the term of this patent is extended or adjusted under 35 U.S.C. 154(b) by 775 days.

(21) Appl. No.: 13/463,737

(22) Filed: May 3, 2012

(65) Prior Publication Data
US 2013/0292721 A1   Nov. 7, 2013

(51) Int. Cl.
| | |
|---|---|
| H01L 33/58 | (2010.01) |
| H01L 33/60 | (2010.01) |
| G02B 23/24 | (2006.01) |
| G02B 19/00 | (2006.01) |

(52) U.S. Cl.
CPC ........... *H01L 33/60* (2013.01); *G02B 19/0061* (2013.01); *G02B 23/2469* (2013.01)

(58) Field of Classification Search
USPC .............................. 257/98, E33.06
See application file for complete search history.

(56) References Cited

U.S. PATENT DOCUMENTS

| | | | | |
|---|---|---|---|---|
| 4,339,689 A | * | 7/1982 | Yamanaka et al. | 313/499 |
| 5,175,783 A | * | 12/1992 | Tatoh | G02B 6/4202 250/227.11 |
| 6,459,835 B1 | * | 10/2002 | Nagaoka | G02B 6/4206 385/33 |
| 2004/0008952 A1 | | 1/2004 | Kragl | |
| 2005/0229345 A1 | * | 10/2005 | Rouse et al. | 15/105 |
| 2010/0243870 A1 | | 9/2010 | Sakaguchi | |
| 2011/0257483 A1 | * | 10/2011 | Mizuyoshi | A61B 1/0684 600/178 |

FOREIGN PATENT DOCUMENTS

| | | |
|---|---|---|
| EP | 1 348 143 B1 | 9/2005 |
| JP | 5-113526 | 5/1993 |
| JP | 2003-262763 | 9/2003 |

* cited by examiner

*Primary Examiner* — Hrayr A Sayadian
(74) *Attorney, Agent, or Firm* — Gordon & Rees, LLP

(57) ABSTRACT

An embodiment of the present invention relates to a radiation emitting device comprising:
- a radiation emitter for generating radiation;
- a waveguide;
- a lens placed between the radiation emitter and the waveguide and directing a first portion of the radiation towards the waveguide;
- a sleeve that comprises a reflective inner surface and is placed between the radiation emitter and the waveguide, said inner reflective surface coupling a second portion of the radiation into the waveguide;
- wherein the lens and the sleeve are separate components that can be positioned relative to each other during fabrication of the radiation emitting device.

15 Claims, 7 Drawing Sheets

RADIATION EMITTING DEVICE

The invention relates to a radiation emitting device and to methods for fabricating radiation emitting devices. In particular, the invention relates to radiation emitting devices that can be used in endoscopy applications.

BACKGROUND OF THE INVENTION

European Patent EP 1 348 143 describes a radiation emitting device that comprises a radiation emitter, a waveguide, and a parabolic mirror placed between the radiation emitter and the waveguide.

Further radiation emitting devices with parabolic mirrors are disclosed in Japanese Patent Applications JP05113526A and JP 2003262763A.

U.S. Patent Application US 2010/0243870 describes a radiation emitting device that comprises a radiation emitter, a waveguide, and a lens placed between the radiation emitter and the waveguide.

OBJECTIVE OF THE PRESENT INVENTION

An objective of the present invention is to provide a radiation emitting device that can be fabricated in a reliable fashion.

A further objective of the present invention is to provide a method for reliably fabricating radiation emitting devices.

BRIEF SUMMARY OF THE INVENTION

An embodiment of the present invention relates to a radiation emitting device comprising:
  a radiation emitter for generating radiation;
  a waveguide;
  a lens placed between the radiation emitter and the waveguide and directing a first portion of the radiation towards the waveguide;
  a sleeve that comprises a reflective inner surface and is placed between the radiation emitter and the waveguide, said inner reflective surface coupling a second portion of the radiation into the waveguide;
  wherein the lens and the sleeve are separate components that can be positioned relative to each other during fabrication of the radiation emitting device.

An advantage of this embodiment of the invention is that the divergence and/or intensity of the emitted radiation at the distal end of the waveguide may be adjusted and optimized during fabrication. This is possible because the lens and the sleeve are separate components and can be positioned relative to each other during the fabrication.

The inner reflective surface of the sleeve preferably forms a truncated cone.

The diameter of the truncated cone preferably narrows in a linear fashion. In other words, with respect to the cross section, the sidewall of the truncated cone preferably forms a straight line or has a linear slope. This allows achieving a predefined divergence of the emitted radiation at the distal end of the waveguide. A predefined divergence is advantageous to adapt to different endoscopy applications.

The lens is preferably positioned inside the truncated cone of the sleeve.

The radiation emitter may be carried by a carrier. The carrier and the sleeve are preferably separate components that can be positioned relative to each other during fabrication of the radiation emitting device.

The waveguide preferably comprises a core and a cladding. The diameter of the lens is preferably smaller than the diameter of the waveguide's core.

The waveguide is preferably connected to the sleeve.

According to a preferred embodiment, the sleeve has a first opening facing the waveguide, and a second opening facing the radiation emitter. The first opening is preferably larger than the second opening. The diameter of the waveguide's core preferably corresponds to the diameter of the sleeve's first (wider) opening.

The emitting surface of the radiation emitter may be positioned in the same plane as the carrier's surface that faces the waveguide.

The lens may have a hemispherical or any other shape.

In case of a hemispherical lens the bottom surface of the hemispherical lens is preferably positioned in the same plane as the carrier's surface and the emitting surface of the radiation emitter.

The waveguide may be a multimode optical fiber or rod. Alternatively, the waveguide may consist of a bundle of optical fibers or rods.

The radiation emitter may be a light emitting semiconductor diode.

A further embodiment of the present invention relates to a method of fabricating a radiation emitting device, comprising the steps of:
  placing a lens between a radiation emitter that is capable of generating radiation, and a waveguide, said lens being capable of directing a first portion of the radiation towards the waveguide;
  placing a sleeve between the radiation emitter and the waveguide, said sleeve comprising a reflective inner surface that is capable of coupling a second portion of the radiation into the waveguide;
  activating the radiation emitter and inputting light in a proximal end of the waveguide; and
  adjusting the distance between the lens and the sleeve or the penetration depth of the lens inside the sleeve in order to achieve a predefined divergence of the light beams that exit the waveguide at a distal end of the waveguide.

Preferably, a lens-emitter-carrier unit is pre-fabricated. Then, the step of adjusting the distance between the lens and the sleeve may be carried out by adjusting the distance between the pre-fabricated lens-emitter-carrier unit and the sleeve.

Further, the waveguide may be connected to the sleeve to form a pre-fabricated waveguide-sleeve unit. Then, the step of adjusting the distance between the lens and the sleeve may carried out by adjusting the distance between the pre-fabricated waveguide-sleeve unit and the lens.

Further, a lens-emitter-carrier unit may be pre-fabricated, and a waveguide may be connected to the sleeve to form a pre-fabricated waveguide-sleeve unit. Then, the step of adjusting the distance between the lens and the sleeve may be carried out by adjusting the distance between the pre-fabricated waveguide-sleeve unit and the prefabricated lens-emitter-carrier unit.

A further embodiment of the present invention relates to a method of fabricating a radiation emitting device, comprising
  placing a lens between a radiation emitter that is capable of generating radiation, and a waveguide, said lens being capable of directing a first portion of the radiation towards the waveguide;
  placing a sleeve between the radiation emitter and the waveguide, said sleeve comprising a reflective inner surface that is capable of coupling a second portion of the radiation into the waveguide;

activating the radiation emitter and inputting light in a proximal end of the waveguide; and adjusting the distance between the lens and the sleeve in order to achieve a predefined maximum coupling ratio between the radiation emitter and the waveguide and/or to achieve a maximum radiation at the distal end of the waveguide.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended figures. Understanding that these figures depict only typical embodiments of the invention and are therefore not to be considered to be limiting of its scope, the invention will be described and explained with additional specificity and detail by the use of the accompanying drawings in which.

DETAILED DESCRIPTION OF THE PREFERRED EMBODIMENTS

The preferred embodiments of the present invention will be best understood by reference to the drawings, wherein identical or comparable parts are designated by the same reference signs throughout. It will be readily understood that the present invention, as generally described herein, could vary in a wide range. Thus, the following more detailed description of the exemplary embodiments of the present invention, is not intended to limit the scope of the invention, as claimed, but is merely representative of presently preferred embodiments of the invention.

An exemplary embodiment of a method for fabricating a radiation emitting device 10 will be explained hereinafter referring to FIGS. 1-6.

An emitter-carrier unit 20 is pre-fabricated by positioning a radiation emitter 30 on top of a carrier 40. The radiation emitter 30 may be a semiconductor diode such as a luminescence diode (LED) or laser diode.

Figure 1:
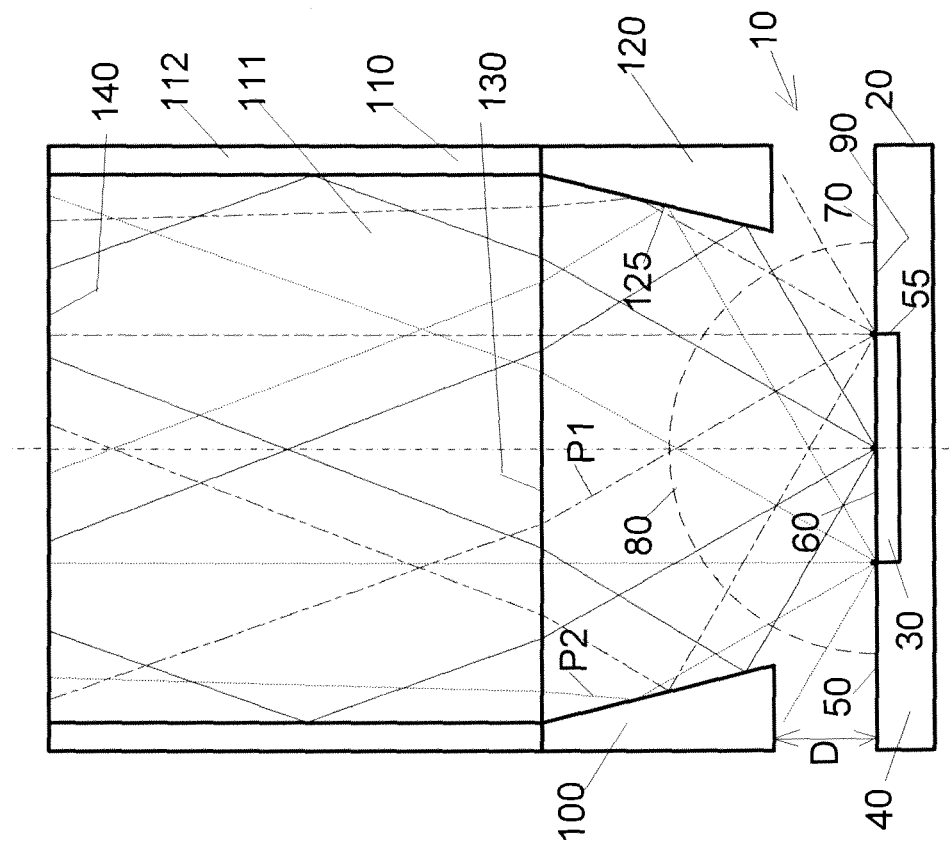
FIG. 1 shows the adjustment of a pre-fabricated emitter-carrier unit with respect to a pre-fabricated waveguide-sleeve unit.

The radiation emitter 30 may be monolithically integrated into the carrier 40 or fabricated separately. In the latter case, the pre-fabricated radiation emitter 30 may be simply placed on the surface 50 of the carrier 40 or in a recess 55 provided in the surface 50. As can be seen in FIG. 1, the emitting surface 60 of the radiation emitter 30 is preferably positioned in the same plane as the surface 50 of the carrier 40. The pre-fabricated radiation emitter 30 may comprise a plurality of layers that may differ in their function, for instance layers that generate radiation and other layers which do not. As such, the term "emitting surface 60" refers to the surface where the generated radiation leaves the pre-fabricated radiation emitter 30, and not necessarily to the layer where the radiation is generated. Furthermore, additional layers may be arranged on top of the pre-fabricated radiation emitter 30 at a later stage. Those additional layers may then be considered to be a part of the pre-fabricated radiation emitter 30, and the term "emitting surface 60" then refers to the uppermost layer.

In order to create a pre-fabricated lens-emitter-carrier unit 70, a lens 80 is placed and fixed on top of the emitter-carrier unit 20 and in particular on top of the emitting surface 60 of the radiation emitter 30.

The lens 80 may have a hemispherical shape as shown or any other shape. In case of a hemispherical shape, the circular bottom 90 of the lens 80 may be positioned in the same plane as the carrier's surface 50 and the emitting surface 60 of the radiation emitter 30.

Additionally, a waveguide-sleeve unit 100 is pre-fabricated by connecting a waveguide 110 with a sleeve 120. The waveguide 110 of FIG. 1 is a multimode fiber or rod, and consists of an inner core 111 and an outer cladding 112. Alternatively, the waveguide 110 may be comprised of a bundle of singlemode or multimode fibers, or singlemode or multimode rods.

The sleeve 120 has a first opening that faces the waveguide 110, and a second opening that faces the radiation emitter 30. It can be seen that the first opening is larger or wider than the second opening. The inner surface 125 is reflective and forms a reflective truncated cone.

In FIG. 1, which shows the cross section of the truncated cone, it can be seen that the diameter of the truncated cone preferably narrows in a linear fashion. In other words, with respect to the cross section, the sidewall of the truncated cone preferably forms a straight line or has a linear slope. The angle γ (see FIG. 3) of the linear slope is preferably between 10° and 20° (e.g. 15°).

The sleeve 120 may consist of metal (e.g. aluminium).

Furthermore, FIG. 1 shows that the diameter of the inner core 111 of the waveguide 110 preferably corresponds to the diameter of the sleeve's first (wider) opening. The diameter of the lens 80 is preferably smaller than the diameter of the inner core 111.

Then, the distance D between the pre-fabricated waveguide-sleeve unit 100 and the pre-fabricated lens-emitter-carrier unit 70 is adjusted relative to each other. Thereby, the lens 80 is positioned inside the sleeve 120 and placed between the radiation emitter 30 and the waveguide 110. As such, the lens 80 can direct a first portion P1 of radiation that is generated by the radiation emitter 30, towards the waveguide 110.

A second portion of the radiation P2 that is generated by the radiation emitter 30, is coupled into the waveguide 110 by the reflective inner surface 125 of the sleeve 120.

In a further step, the radiation emitter 30 is activated and light is inputted in the proximal end 130 of the waveguide 110. Then, the distance D between the pre-fabricated waveguide-sleeve unit 100 and the pre-fabricated lens-emitter-carrier unit 70, and the penetration depth of the lens 80 inside the sleeve 120 is adjusted to generate either a maximum radiation or a predefined divergence at the distal end 140 of the waveguide 110. For instance, the predefined divergence may be the maximum divergence that can be obtained by adjusting the distance D between the pre-fabricated waveguide-sleeve unit 100 and the pre-fabricated lens-emitter-carrier unit 70.

If the radiation device 10 is meant to be used as an endoscope or as a part of an endoscope apparatus, the distance D is preferably chosen such that the divergence at the distal end 140 of the waveguide 110 reaches its predefined value (e.g. the maximum value that is obtainable).

Figure 2:
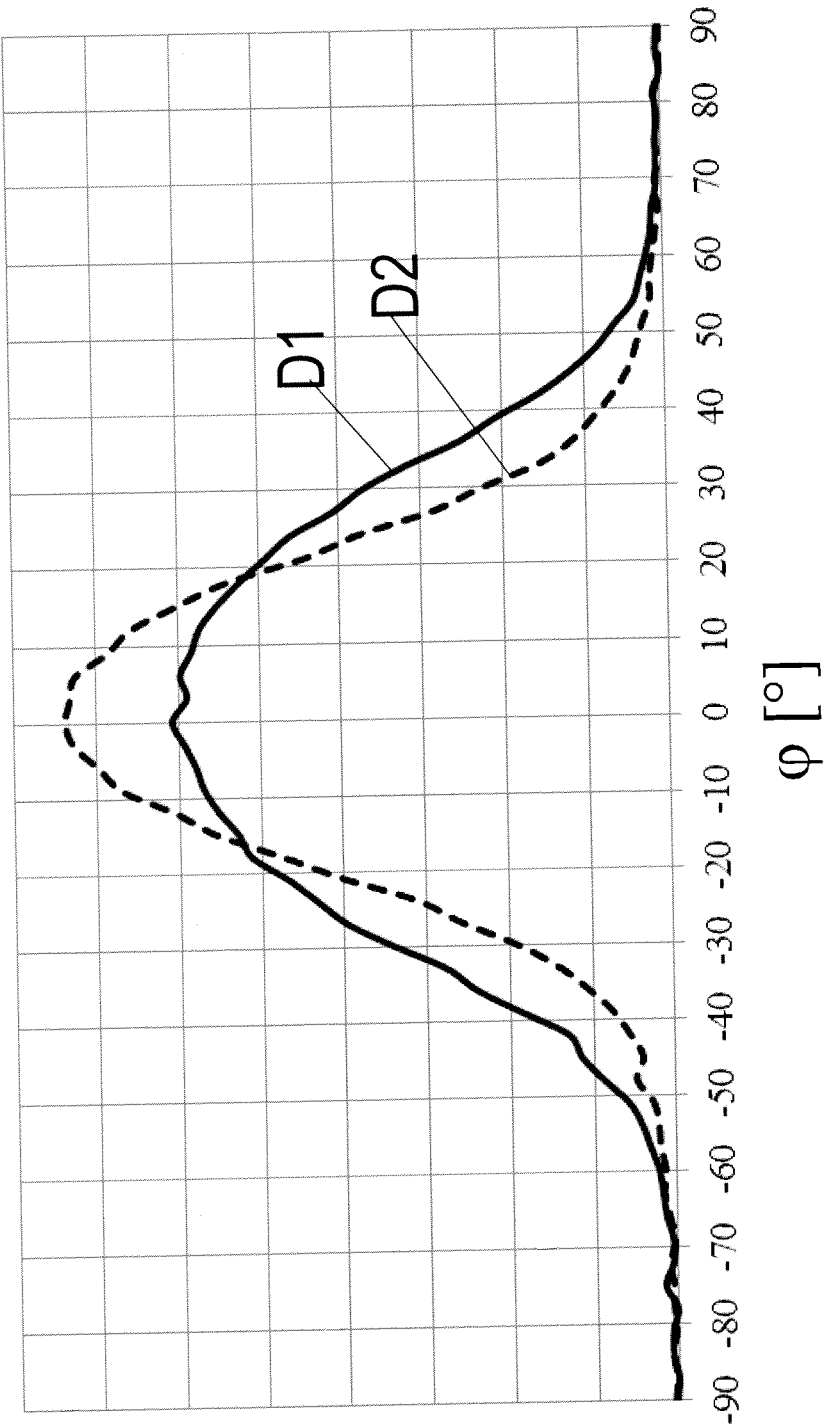
FIG. 2 shows the intensity of radiation as a function of the radiation angle of two distances D1 and D2 between the pre-fabricated emitter-carrier unit and the pre-fabricated waveguide-sleeve unit of FIG. 1.

FIG. 2 shows the radiation intensity I(φ) at the distal end 140 of the waveguide 110 over the radiation angle φ for two different distances D=D1 and D=D2. It can be seen that the divergence and the overall radiation power varies if the distance D between the pre-fabricated waveguide-sleeve unit 100 and the pre-fabricated lens-emitter-carrier unit 70 is changed. The overall radiation power Ptotal may be calculated as follows:

$$P_{total} = \int_{-90°}^{+90°} I(\varphi)\,d\varphi$$

Figure 3:
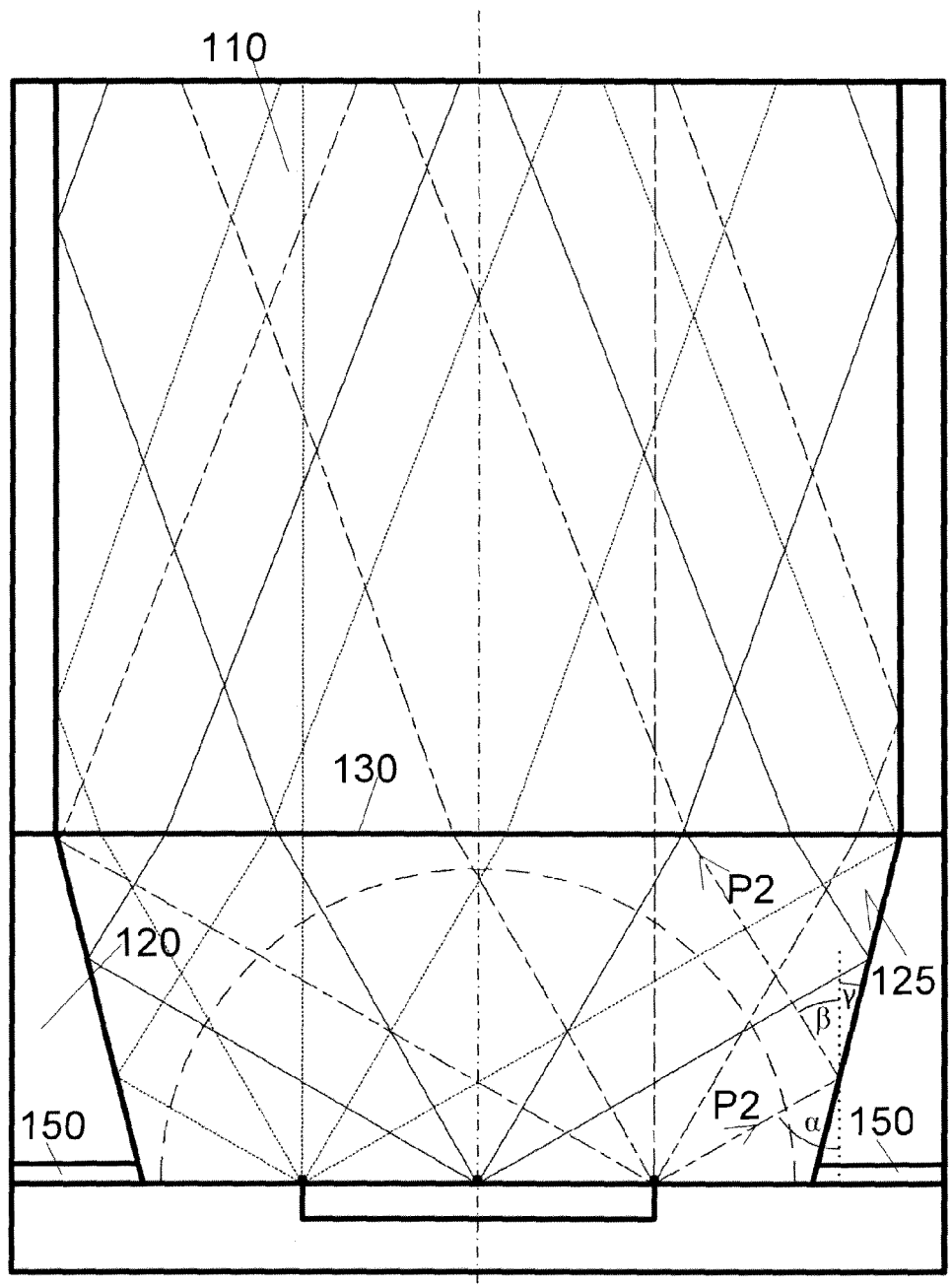
FIG. 3 shows an exemplary embodiment of a radiation emitting device that comprises the emitter-carrier unit and the waveguide-sleeve unit of FIG. 1, FIG. 4 visualizes the radiation angle versus location in the plane of the emitting surface of a radiation emitter of the radiation emitting device of FIG. 3, FIG. 5 visualizes the radiation angle versus location in the plane of a proximal end of a waveguide of the radiation emitting device of FIG. 3, as well as the acceptance angle and acceptance location of a waveguide, FIG. 6 visualizes the influence of a sleeve of the waveguide-sleeve unit of the radiation emitting device of FIG. 3.

When the optimum distance between the pre-fabricated waveguide-sleeve unit 100 and the pre-fabricated lens-emitter-carrier unit 70 is found, the relative position between both units may be fixed, for instance with an adhesive 150 as shown in an exemplary fashion in FIG. 3.

As discussed above with respect to FIG. 1, the diameter of the truncated cone preferably narrows in a linear fashion. A linear slope yields the advantage that a collimation of radiation that is reflected by the inner surface 125 is achieved. As a result, a predefined divergence of radiation at the distal end 140 of the waveguide 110 may be achieved. This is advantageous if the radiation emitting device 10 is used as an endoscope or as a part of an endoscope apparatus.

FIG. 3 further illustrates the influence of the sleeve 120 in further detail. It is assumed that the radiation angle α of radiation P2 is larger than the acceptance angle of the waveguide 110. As such, the radiation P2 would not be coupled into the waveguide 110 and would not reach the distal end 140 of the waveguide 110.

However, the inner surface 125 of the sleeve 120 reduces the radiation angle α of the emitted radiation P2 with respect to the waveguide 110. This effect depends on the slope or angle γ of the truncated cone. The angle reduction may be calculated as follows:

$$\beta = \alpha - 2\gamma$$

wherein α describes the emission angle before reflexion at the inner surface 125 and β describes the emission angle after reflexion at the inner surface 125.

The reduction of the radiation angle with respect to the proximal end 130 of the waveguide 110 provides that the radiation P2 can be coupled into the waveguide 110.

The influence of the sleeve 120 on the coupling efficiency will be explained below in further detail with reference to FIGS. 4-6.

Figure 4:
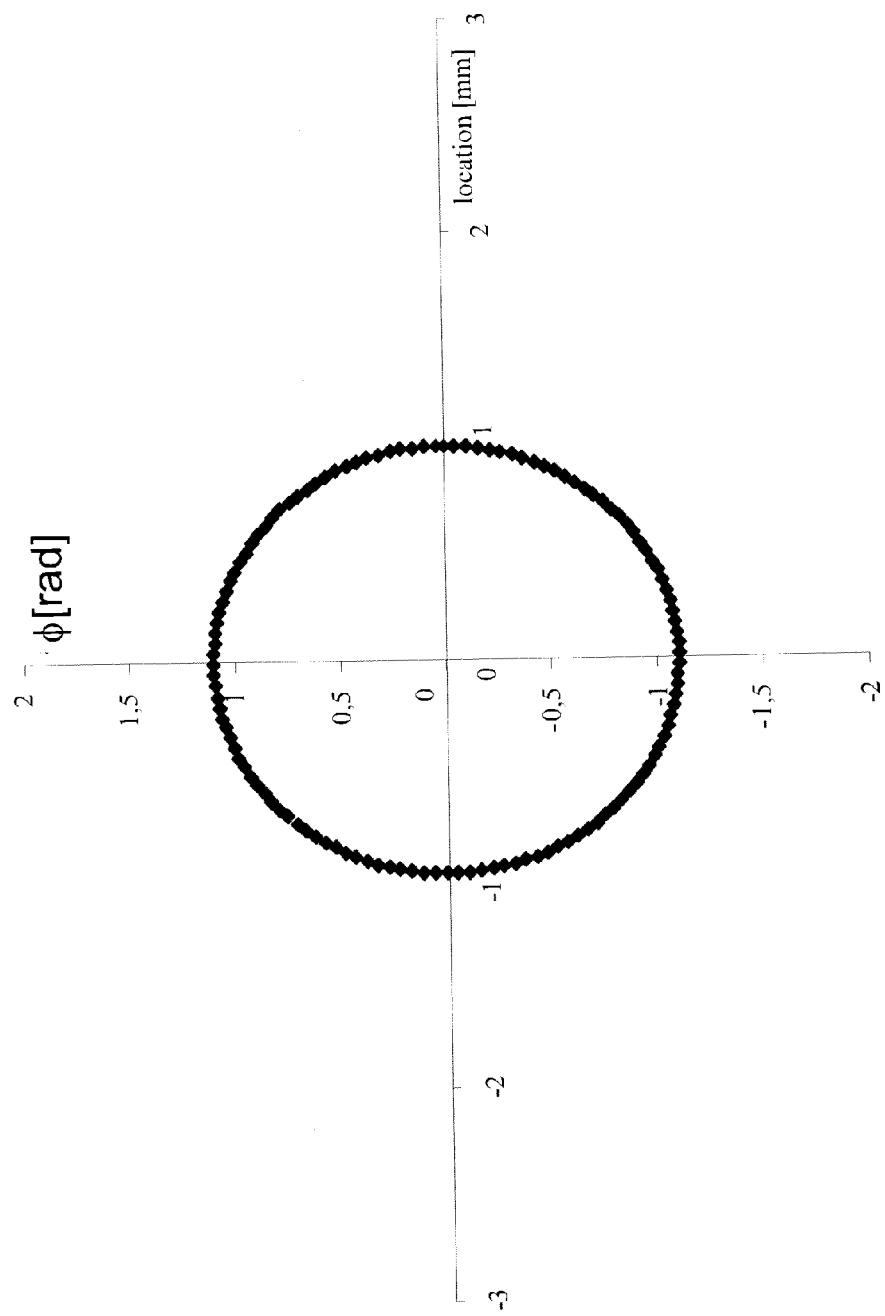

FIG. 4 shows a curve RA that visualizes the angle φ of the emitted radiation versus location with respect to the plane of the emitting surface 60 in an exemplary fashion. It is assumed that the diameter of the emitting surface 60 is 2 mm and that the maximum radiation angle is 65° (1.1 rad). FIG. 4 shows that the radiation angle φ varies over the location. The radiation angle φ reaches its maximum in the center area (location 0 mm) of the emitting surface 60, and approaches zero at both edges of the emitting surface 60 (location±1 mm).

Figure 5:
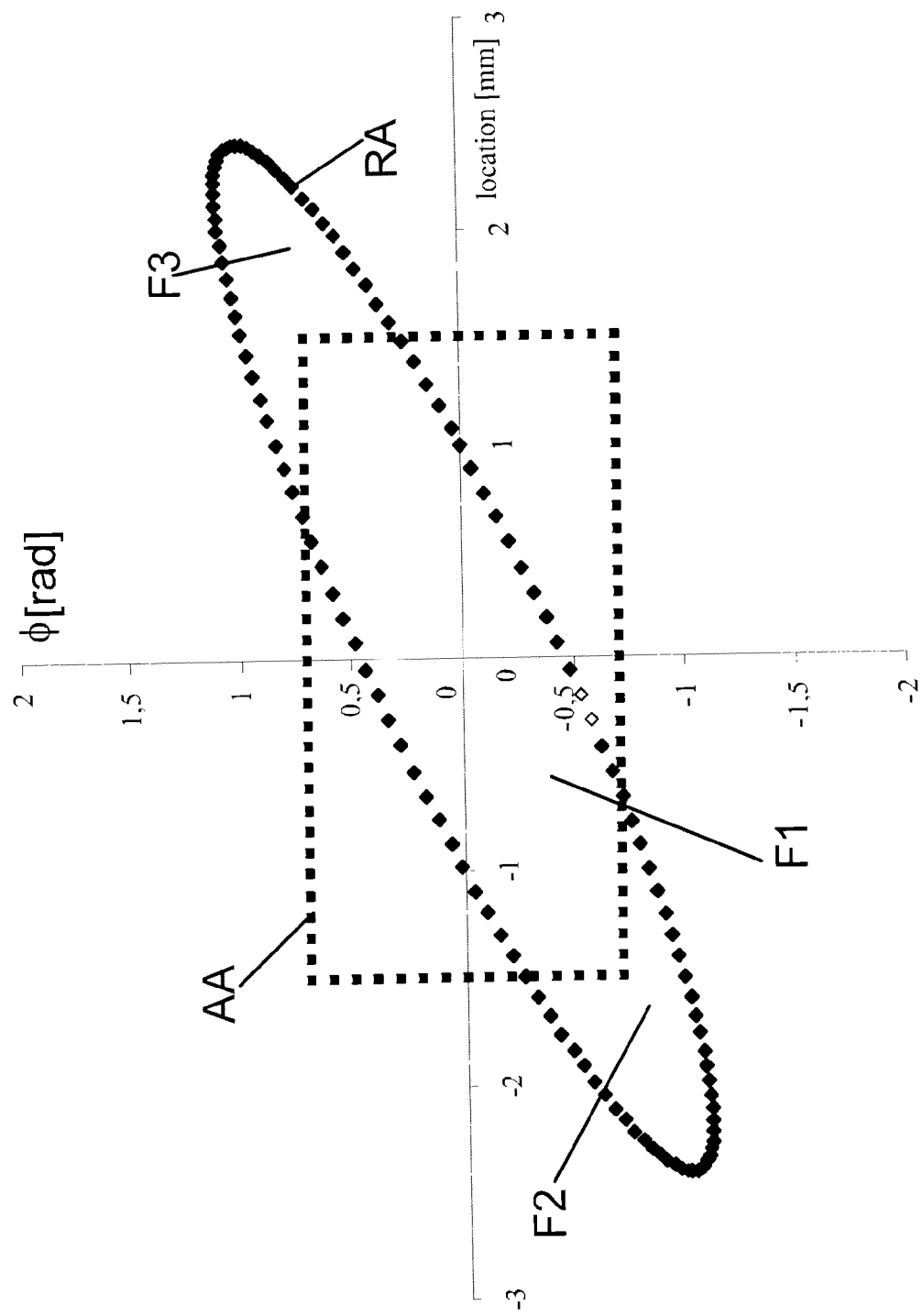

In FIG. 5, the curve RA visualizes the radiation angle φ of the radiation versus the location in the plane of the proximal end 130 of the waveguide 110 (see FIG. 1). It can be seen that the curve RA has changed its shape (compared with FIG. 4) and that the radiation angle φ is larger than in FIG. 4. In FIG. 5, it is assumed in an exemplary fashion that the distance between the proximal end 130 of the waveguide 110 and the emitting surface 60 is 2 mm.

Furthermore, FIG. 5 shows a curve AA that visualizes the acceptance angle range of the waveguide 110. It is assumed in an exemplary fashion that the acceptance angle is 80° (±40°) and that the diameter of the waveguide core is 3 mm.

The area F1, where the section surrounded by curve RA and the section surrounded by curve AA overlap, determines the first portion P1 of the radiation that is directly coupled by the lens 80 into the waveguide 110 (see FIG. 1).

The remaining two sections F2 and F3 that are surrounded by curve RA but lie outside the section surrounded by curve AA, determine the radiation that would not be coupled into the waveguide 110 without the sleeve 120.

Figure 6:
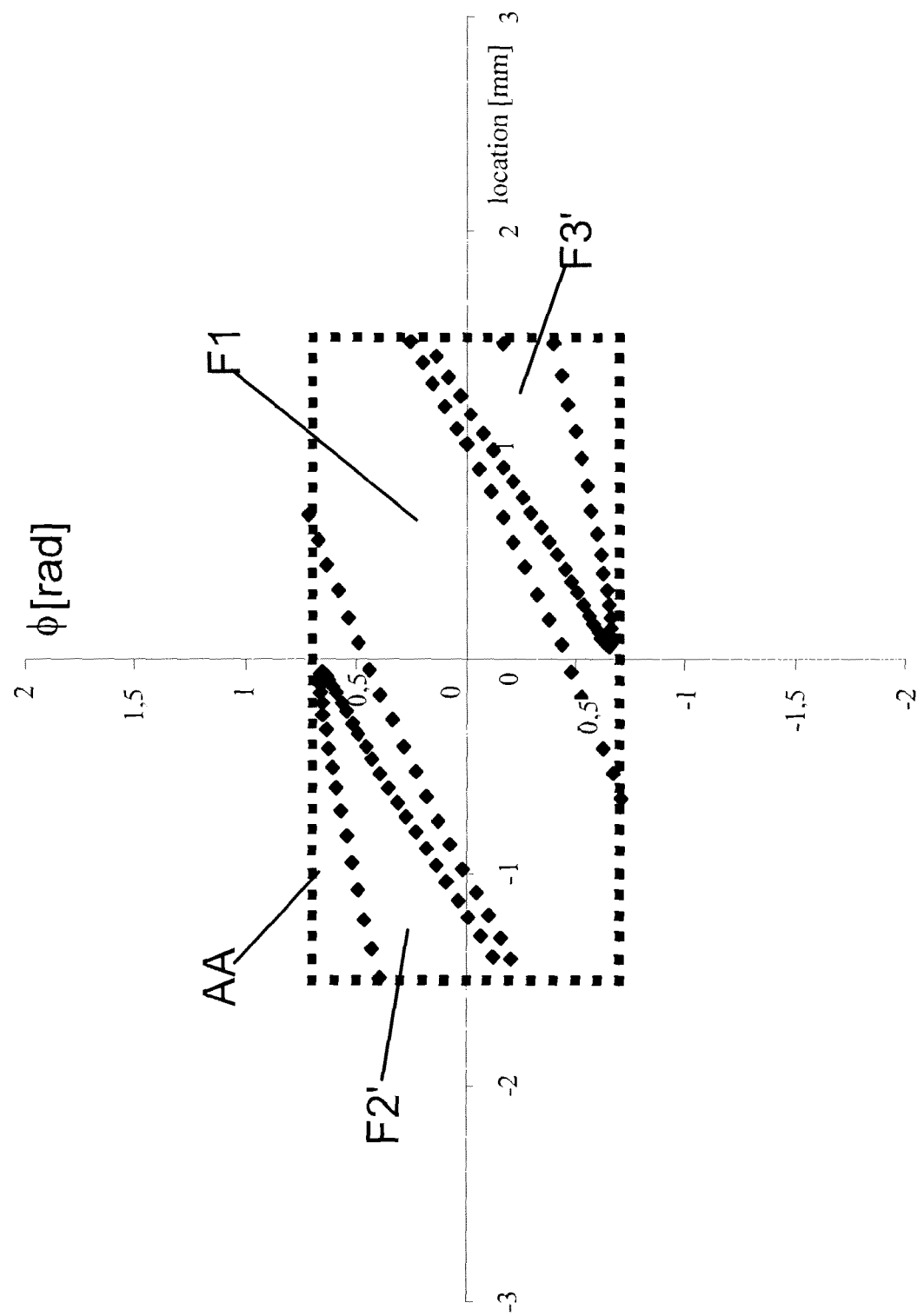

FIG. 6 shows the influence of the sleeve 120 on the coupling efficiency. It can be seen that sections F2 and F3 of FIG. 5 are folded into the acceptance range of the waveguide 110. The folded sections F2' and F3' describe the second portion P2 (see FIG. 1) of radiation that is coupled via the sleeve 120 into the waveguide 110.

Figure 7:
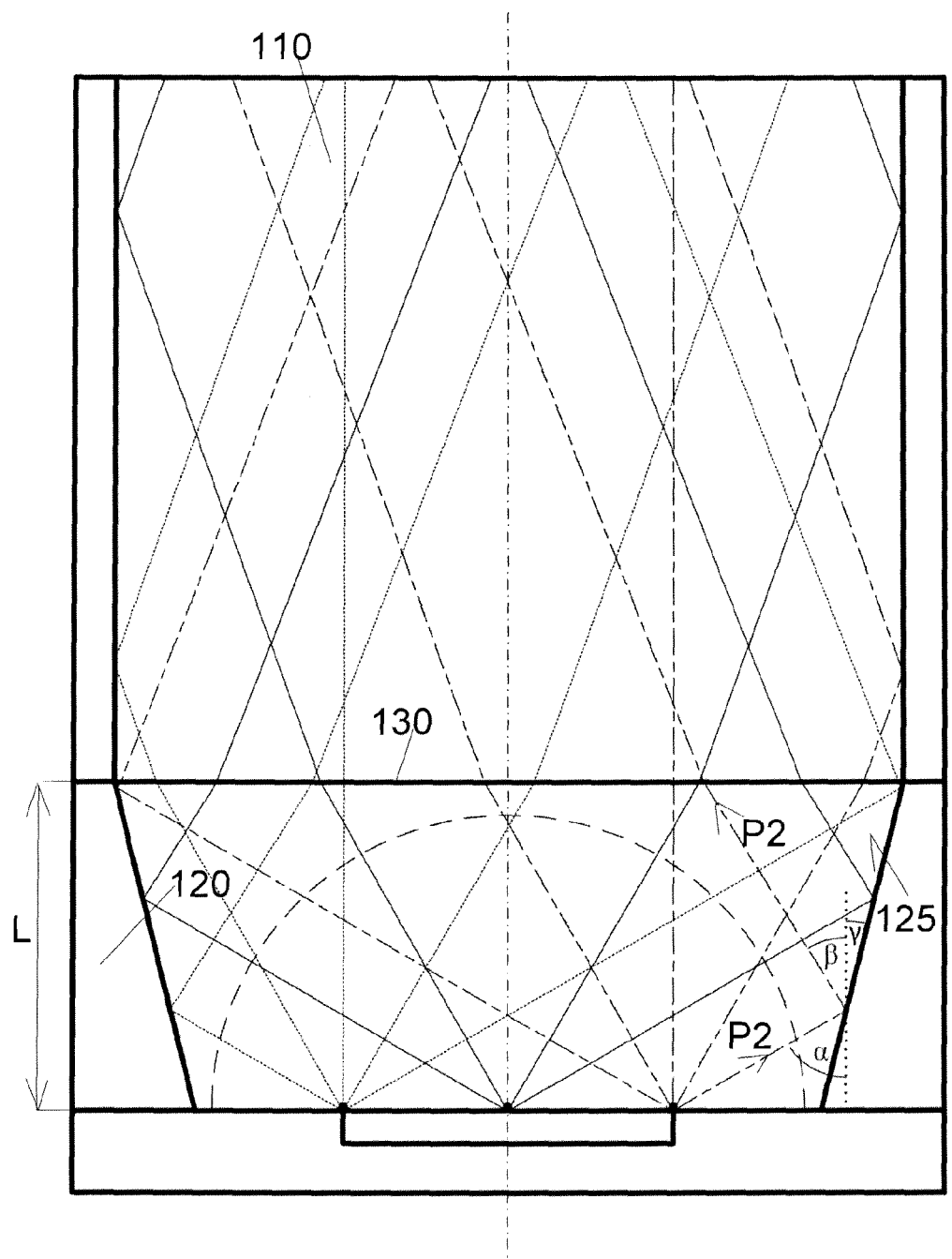
FIG. 7 shows a further exemplary embodiment of a radiation emitting device.

FIG. 7 shows a second exemplary embodiment of a radiation emitting device 10. Here, the distance between the waveguide 110 and the pre-fabricated emitter-carrier unit 20 is determined by the length L of the sleeve 120, only, since the pre-fabricated emitter-carrier unit 20 is directly mounted on the sleeve 120. An adjustment between the fabricated emitter-carrier unit 20 and the waveguide-sleeve unit 100 is therefore not mandatory. For the rest, the radiation emitting device 10 of FIG. 7 corresponds to embodiment of FIG. 3.

REFERENCE SIGNS 10 radiation emitting device
20 emitter-carrier unit
30 radiation emitter
40 carrier
50 surface of carrier
55 recess
60 emitting surface of radiation emitter
70 lens-emitter-carrier unit
80 lens
90 bottom
100 waveguide-sleeve unit
110 waveguide
111 inner core
112 outer cladding
120 sleeve
125 reflective inner surface
130 proximal end
140 distal end
150 adhesive
RA curve
AA curve
D distance
D1 distance D2 distance
F1 area
F2 section
F3 section
F2' section
F3' section
L length of the sleeve
P1 first portion of radiation
P2 second portion of radiation
φ, γ angle
α, γ radiation angle The invention is:

1. A radiation emitting device comprising:
    a radiation emitter that generates a radiation;
    a waveguide;
    a lens placed between the radiation emitter and the waveguide and directing a first portion of the generated radiation towards the waveguide; and
    a sleeve that comprises a reflective inner surface and is placed between the radiation emitter and the waveguide such that an end of the sleeve contacts an end of the waveguide, said inner reflective surface coupling a second portion of the generated radiation into the end of the waveguide,
    wherein the inner reflective surface of said sleeve forms a truncated cone, wherein the lens is positioned inside the truncated cone of the sleeve, wherein the sleeve has a first opening facing the waveguide and a second opening facing the radiation emitter, wherein the first opening is larger than the second opening, and wherein the diameter of a core of the waveguide is equal to the diameter of the sleeve's first opening, and
    wherein the lens and the sleeve are separate components that can be positioned relative to each other during fabrication of the radiation emitting device.

2. The radiation emitting device according to claim 1, wherein the radiation emitter is disposed on a carrier.

3. The radiation emitting device according to claim 2, wherein the carrier and the sleeve are separate components that can be positioned relative to each other during fabrication of the radiation emitting device.

4. The radiation emitting device according to claim 1, wherein the waveguide comprises a core and a cladding.

5. The radiation emitting device according to claim 4, wherein the diameter of the lens is smaller than the diameter of the waveguide's core.

6. The radiation emitting device according to claim 1, wherein the lens is integrated in a carrier such that an emitting surface of the radiation emitter is positioned in the same plane as a surface of the carrier that faces the waveguide.

7. The radiation emitting device according to claim 1, wherein the lens is shaped as a hemisphere.

8. The radiation emitting device according to claim 7, wherein the bottom surface of the lens is positioned in the same plane as a surface of a carrier and an emitting surface of the radiation emitter.

9. The radiation emitting device according to claim 1, wherein the waveguide is a multimode optical fiber or rod.

10. The radiation emitting device according to claim 1, wherein the radiation emitter is a light emitting semiconductor diode.

11. The radiation emitting device according to claim 1, wherein the sleeve consists of a metal.

12. The radiation emitting device according to claim 2, wherein the sleeve is directly mounted on the carrier.

13. The radiation emitting device according to claim 1, wherein the diameter of the sleeve linearly narrows from the diameter of the first opening to the diameter of the second opening.

14. The radiation emitting device according to claim 13, wherein the slope of the sleeve ranges from about 10° to about 20°.

15. An endoscope apparatus comprising the radiation emitting device of claim 1.

* * * * *